US010707279B2

(12) United States Patent
Jang et al.

(10) Patent No.: US 10,707,279 B2
(45) Date of Patent: Jul. 7, 2020

(54) METHOD OF SENSING ILLUMINANCE USING PASSIVE MATRIX ORGANIC LIGHT EMITTING DIODE DISPLAY INCLUDING ILLUMINANCE SENSOR FUNCTION AND METHOD OF CONTROLLING THE SAME

(71) Applicant: Solomon Systech (Shenzhen) Limited, Shenzhen (CN)

(72) Inventors: Hong Jae Jang, Seoul (KR); Hyung-Cheol Shin, Daejeon (KR); Il-Hyun Yun, Daejeon (KR); Wai Hon Ng, Hong Kong (HK); Yi Nok Chan, Hong Kong (HK); King Ho Cheung, Hong Kong (HK); Yip Fai Li, Hong Kong (HK)

(73) Assignee: Solomon Systech (Shenzhen) Limited, Shenzhen (CN)

( * ) Notice: Subject to any disclaimer, the term of this patent is extended or adjusted under 35 U.S.C. 154(b) by 0 days.

(21) Appl. No.: 16/143,442

(22) Filed: Sep. 26, 2018

(65) Prior Publication Data
US 2019/0103446 A1 Apr. 4, 2019

(30) Foreign Application Priority Data

Sep. 29, 2017 (KR) .................. 10-2017-0127445

(51) Int. Cl.
*H01L 27/32* (2006.01)
*H01L 51/52* (2006.01)
(Continued)

(52) U.S. Cl.
CPC .......... *H01L 27/3227* (2013.01); *G06F 3/044* (2013.01); *G06F 3/0412* (2013.01);
(Continued)

(58) Field of Classification Search
CPC . H01L 27/3227; H01L 27/322; H01L 27/323; H01L 27/3288; H01L 51/5206;
(Continued)

(56) References Cited

U.S. PATENT DOCUMENTS

2005/0200292 A1* 9/2005 Naugler, Jr. .......... G06F 3/0412
315/149
2006/0007205 A1* 1/2006 Reddy ................. G06F 3/03542
345/204

OTHER PUBLICATIONS

Office Action issued in corresponding Korean patent application No. 1020170127445 dated Sep. 18, 2018.

* cited by examiner

*Primary Examiner* — Julie Anne Watko
(74) *Attorney, Agent, or Firm* — Idea Intellectual Limited; Margaret A. Burke; Sam T. Yip

(57) ABSTRACT

Provided is a method of sensing an illuminance in a passive matrix organic light emitting diode display, the display including a plurality of lower electrode patterns arranged in parallel, a plurality of transparent electrode patterns arranged in parallel and being perpendicular to the lower electrode patterns, and an organic compound layer interposed between the lower electrode pattern and the transparent electrode pattern, the method comprising steps of: (a) forming a predetermined voltage difference between at least one electrode patterns of the transparent electrode patterns as anodes and the lower electrode patterns as cathodes; (b) measuring the magnitude of current formed by the transparent electrode pattern and the lower electrode pattern in the step (a); and (c) measuring an illuminance using the measured current, in which a voltage supplied to the lower electrode pattern is relatively higher than that of the transparent electrode pattern in the step (a).

16 Claims, 10 Drawing Sheets

(51) Int. Cl.
  *G09G 3/3216*  (2016.01)
  *G06F 3/044*  (2006.01)
  *H01L 51/50*  (2006.01)
  *G06F 3/041*  (2006.01)

(52) U.S. Cl.
  CPC ......... *G06F 3/0416* (2013.01); *G09G 3/3216* (2013.01); *H01L 27/323* (2013.01); *H01L 27/3288* (2013.01); *H01L 51/5284* (2013.01); *G09G 2300/0426* (2013.01); *G09G 2360/144* (2013.01); *G09G 2360/145* (2013.01); *H01L 27/322* (2013.01); *H01L 51/504* (2013.01); *H01L 51/5203* (2013.01); *H01L 51/5206* (2013.01)

(58) Field of Classification Search
  CPC ............... H01L 51/5284; H01L 51/504; H01L 27/3225; H01L 27/3206; H01L 27/32; H01L 27/28; H01L 27/00; H01L 27/3281; H01L 27/3283; H01L 51/56; H01L 51/5203; G06F 3/0412; G06F 3/0416; G06F 3/044; G06F 3/03542; G06F 3/03545; G06F 3/03547; G06F 3/0304; G06F 3/041; G06F 3/033; G06F 3/0325; G06F 3/01; G06F 3/00; G09G 3/3216; G09G 2300/0426; G09G 2360/145; G09G 3/32; G09G 3/22; G09G 3/20; G09G 3/00; G09G 2300/0404; G09G 2300/00; G09G 2360/144; G01J 1/42
  See application file for complete search history.

METHOD OF SENSING ILLUMINANCE USING PASSIVE MATRIX ORGANIC LIGHT EMITTING DIODE DISPLAY INCLUDING ILLUMINANCE SENSOR FUNCTION AND METHOD OF CONTROLLING THE SAME

COPYRIGHT NOTICE

A portion of the disclosure of this patent document contains material, which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

CROSS-REFERENCE TO RELATED APPLICATION

The present invention claims priority to Korean Patent Application No. 10-2017-0127445 filed Sep. 29, 2017, the disclosure of which is incorporated by reference herein.

FIELD OF THE INVENTION

The present invention relates to a display using a passive matrix organic light emitting diode (PMOLED) among organic light emitting diodes and more particularly, to a PMOLED display capable of adding an illuminance sensor function while implementing the display as an in-cell structure in the PMOLED.

BACKGROUND

Since an organic light emitting diode emits light directly from a light emitting layer located between a cathode and an anode, there is an advantage that there is no need for a backlight, the expression range of light is wider than that of a Liquid Crystal Display (LCD), and a black level is excellent. That is, when a voltage is applied to the cathode and the anode in the organic light emitting diode, electrons and holes are injected from each electrode, and the injected electrons and holes pass through an electron transport layer and a hole transport layer to couple the electrons and holes in the light emitting layer.

A light emitting material of the light emitting layer is excited by the energy due to the coupling, and light is generated when the light emitting material returns from the excited state to a ground state again. The light emitted when returning from the excited state (singlet state) to the ground state is fluorescence, and the light emitted when returning from the singlet state to the ground state via a triplet state which has a somewhat low energy level is phosphorescence. The energy that can not be used with light even in the excited state may be inactivated without being emitted.

In the organic light emitting diode, a metal thin film such as aluminum, a silver-magnesium alloy or calcium may be used for the cathode, and a transparent metal thin film such as indium tin oxide called ITO may be used for the anode. An organic compound layer formed between the cathode and the anode may include a hole injection layer (HIL), a hole transport layer (HTL), an emission layer (EML), an electron transport layer (ETL), and an electron injection layer (EIL). When a driving voltage is applied between the cathode and the anode, holes passing through the hole transport layer (HTL) and the electrons passing through the electron transport layer (ETL) move to the emission layer (EML) to form excitons, and as a result, the emission layer (EML) generates visible light. The generated light is reflected on a reflection surface and passes through the transparent electrode and a substrate (a glass plate, a plastic plate, etc.).

The organic light emitting diode may be classified into a passive matrix organic light emitting diode (PMOLED) and an active matrix organic light emitting diode (AMOLED) according to a control method thereof.

The PMOLED has a disadvantage in that a voltage is applied to a horizontal axis and a vertical axis of a light emitting device arranged on a screen, respectively, to illuminate an intersection thereof, so that the structure is relatively simple and the production cost is low, but a sophisticated screen may not be realized. The AMOLED is intended to overcome the shortcomings of the PMOLED, and there is an advantage of embedding a thin film transistor (TFT) in each light emitting device so that each device can be individually controlled to emit light. In recent years, since the screen size may be applied to a large device, its application range is widened.

Although Korean Patent Registration No. 10-1170806 discloses a device for a passive matrix, specifically, there is not disclosed a method for implement illuminance sensing and touch sensing in the PMOLED.

BRIEF SUMMARY

An object of the present invention provides a PMOLED display capable of adding an illuminance sensor serve as an in-cell type in a PMOLED.

Another object of the present invention provides a PMOLED display capable of implementing an illuminance sensor function and a touch serve as an in-cell type in the PMOLED.

Yet another object of the present invention provides a PMOLED display capable of eliminating the influence of a residual capacitance in realizing a touch function in a PMOLED.

Still another object of the present invention provides a PMOLED display having an improved structure to implement illuminance sensing and touch functions in a PMOLED.

According to an exemplary embodiment of the present invention, there is provided a method of sensing an illuminance in a passive matrix organic light emitting diode display, the display including a plurality of lower electrode patterns arranged in parallel, a plurality of transparent electrode patterns arranged in parallel and being perpendicular to the lower electrode patterns, and an organic compound layer interposed between the lower electrode pattern and the transparent electrode pattern, the method comprising steps of: (a) forming a predetermined voltage difference between at least one electrode patterns of the transparent electrode patterns as anodes and the lower electrode patterns as cathodes; (b) measuring the magnitude of current formed by the transparent electrode pattern and the lower electrode pattern in the step (a); and (c) measuring an illuminance using the measured current, in which a voltage supplied to the lower electrode pattern is relatively higher than that of the transparent electrode pattern in the step (a).

In the case of the image output using the PMOLED display, a high voltage is applied to the transparent electrode pattern which is the anode and a relatively low voltage or 0 V is applied to the lower electrode pattern which is the cathode. However, according to the present embodiment, for the illuminance sensing, a relatively low voltage is applied to the transparent electrode pattern which is the anode and a relatively high voltage is applied to the lower electrode pattern which is the cathode.

Further, a predetermined voltage is formed between the transparent electrode pattern and the lower electrode pattern for the illuminance sensing instead of simply measuring the current and the current is measured at the predetermined voltage, thereby improving efficiency of the measurement.

In the present embodiment, a predetermined voltage difference at the transparent electrode pattern against the lower electrode pattern for measuring the illuminance may be selected in a range of −20 V to −3 V.

According to another exemplary embodiment of the present invention, there is provided a method of sensing an illuminance in a passive matrix organic light emitting diode display, the display including a plurality of lower electrode patterns arranged in parallel, a plurality of transparent electrode patterns arranged in parallel and being perpendicular to the lower electrode patterns, and an organic compound layer interposed between the lower electrode pattern and the transparent electrode pattern, the method comprising steps of: providing a reference transparent electrode pattern and a comparison transparent electrode pattern selected from the transparent electrode patterns; providing a reference lower electrode pattern and a comparison lower electrode pattern selected from the lower electrode patterns, corresponding to the reference transparent electrode pattern and the comparison transparent electrode pattern; blocking light flowing into the organic compound layer between the comparison transparent electrode pattern and the comparison lower electrode pattern; and measuring an illuminance by comparing an electric feature formed by the reference transparent electrode pattern and the reference lower electrode pattern with an electric feature formed by the comparison transparent electrode pattern and the comparison lower electrode pattern under the same condition.

In the present embodiment, electric features of a current formed by the transparent electrode pattern and the lower electrode pattern and the like may be measured for the illuminance sensing. However, the measured electric features may also be affected by the organic compound layer absorbing light, but may be variously affected by other factors. Therefore, in the present embodiment, the comparison transparent electrode pattern and the comparison lower electrode pattern are provided under the same remaining conditions except for a difference in which the light is absorbed in the organic compound layer to measure a comparison electric feature, and the comparison electric feature is compared with a normal electric feature to minimize a measurement error due to the noise other than the change in the illuminance.

The content according to the present embodiment may form a combination with other methods of sensing an illuminance described above. Specifically, the same predetermined voltage difference is formed between the reference transparent electrode pattern and the reference lower electrode pattern and between the comparison transparent electrode pattern and the comparison lower electrode pattern, a relatively high voltage is provided to the lower electrode pattern as compared with the transparent electrode pattern, and a magnitude of a current formed by the transparent electrode pattern and the lower electrode pattern is measured to measure the illuminance.

Further, a predetermined voltage difference at the transparent electrode pattern against the lower electrode pattern for measuring the illuminance may be selected in a range of −20 V to −3 V.

The electrode patterns used for illuminance sensing, for example, the reference transparent electrode pattern, the reference lower electrode pattern, the comparison transparent electrode pattern and the comparison lower electrode pattern may be used only for the illuminance sensing, and may be provided in the same or a different shape as or from other electrode patterns. Further, the position may be variously disposed, but may also be disposed at the outmost side of the display. Of course, all or some of the transparent electrode patterns and the lower electrode patterns may be used for the illuminance sensing, and here, the transparent electrode patterns and the lower electrode patterns may also be used for the image output or the touch sensing in addition to the illuminance sensing.

The illuminance sensing using the reference transparent electrode pattern, the reference lower electrode pattern, the comparison transparent electrode pattern and the comparison lower electrode pattern may be performed at a time period which is overlapped with or separated from the image output for the PMOLED display. For example, when the reference and comparison electrode patterns described above are exclusively used for the illuminance sensing, other electrode patterns may be performed at a time period which is overlapped with those used for the image output or the touch sensing, and may be performed at a separated time period without being used exclusively.

According to yet another exemplary embodiment of the present invention, there is provided a method of controlling a passive matrix organic light emitting diode display, the display including a plurality of lower electrode patterns arranged in parallel, a plurality of transparent electrode patterns arranged in parallel and being perpendicular to the lower electrode patterns, and an organic compound layer interposed between the lower electrode pattern and the transparent electrode pattern, to perform display output, illuminance sensing and touch sensing by time-sharing a display frame time into a display control period, an illuminance sensing period and a touch sensor control period, the method comprising steps of: providing a driving node, which is formed on a line for connecting the transparent electrode patterns and a display driving circuit and a touch sensing unit for connecting the driving node and a touch sensing circuit; outputting an image by connecting the transparent electrode patterns and the display driving circuit in the display control period; sensing an illuminance by forming a predetermined voltage difference between at least one electrode patterns among the transparent electrode patterns and the lower electrode patterns in the illuminance sensing period; and sensing a touch by connecting the transparent electrode patterns and the touch sensing circuit through the touch sensing unit in the touch sensor control period, in which in the illuminance sensing step, a voltage supplied to the lower electrode pattern is relatively higher than that of the transparent electrode pattern, and the illuminance is measured by measuring the magnitude of a current formed by the transparent electrode pattern and the lower electrode pattern.

In the illuminance sensing, all or some of the transparent electrode patterns and the lower electrode patterns may be used for the illuminance sensing, and the predetermined voltage difference at the transparent electrode pattern against the lower electrode pattern in the illuminance sensing period is selected in a range of −20 V to −3 V, and preferably may be determined around −10 V.

A driving node is provided between the transparent electrode patterns connected with the image driving circuit, and the touch sensing circuit is connected to the driving node through the touch sensing unit. In order to implement the image output and the touch sensing in one display, the display frame time may be time-shared into a display control period, an illuminance sensing period, and a touch sensor control period, and the image output, the illuminance sensing, and the touch sensing may be alternately performed in each control period.

When the display frame time is time-shared, the display control period, the illuminance sensing period, and the touch sensor control period may be disposed in various orders. However, preferably, the display frame time may be repetitively time-shared in the order of the display control period, the illuminance sensing period, and the touch sensor control period or repetitively time-shared in the order of the illuminance sensing period, the display control period, and the touch sensor control period.

In the case of the PMOLED, the touch sensing may not be smoothly performed due to the residual capacitance between the transparent electrode patterns and the lower electrode patterns. As a result, in the present embodiment, in the touch sensing step, a pulse-type driving voltage may be provided to the transparent electrode patterns and the lower electrode patterns or the electrode patterns may be floated. Signals are synchronized between the lower electrode patterns or the electrode patterns regardless of presence or absences of the residual capacitance to easily detect a change in constant voltage or capacitance by an external touch.

In the present embodiment, a touch reference voltage may be uniformly supplied to all the lower electrode patterns before the touch sensor control period, and an display reference voltage may be uniformly supplied to all the lower electrode patterns after the touch sensor control period. The reason is that a voltage set value for the touch sensing and a voltage set value for the image output/illuminance sensing may be different from each other. In the touch sensor control period, a pulse-type driving voltage may be applied in addition to the touch reference voltage.

The display reference voltage may be set to be higher than the touch reference voltage, and the touch reference voltage may be set in a range of about −3 V to about 3 V and the display reference voltage may be set in a range of about 5 V to about 20 V.

In the case of the image output, each transparent electrode pattern may serve as an independent segment (SEG) electrode or an anode electrode. However, in the case of the touch sensing, the transparent electrode pattern may not perform each separated function. In general, the display using the PMOLED does not require a high resolution, and a screen is often constituted by a small screen. Therefore, the touch sensing may be required only when recognizing only a simple operation other than a high resolution.

To this end, two or more transparent electrode patterns form a group, and in the touch sensor control period, the transparent electrode patterns forming the group are connected to one by the touch sensing unit to serve as one touch sensor.

To this end, one touch sensing unit may be connected to a plurality of adjacent driving nodes, and in this case, the plurality of transparent electrode patterns may be grouped and connected to the touch sensing circuit through the touch sensing unit by using a switching unit or the like.

According to still another exemplary embodiment of the present invention, there is provided method of controlling a passive matrix organic light emitting diode display, the display including a plurality of lower electrode patterns arranged in parallel, a plurality of transparent electrode patterns arranged in parallel and being perpendicular to the lower electrode patterns, and an organic compound layer interposed between the lower electrode pattern and the transparent electrode pattern, to implement display output, illuminance sensing and touch sensing by time-sharing a display frame time into at least one of a display control period, an illuminance sensing period and a touch sensor control period, the method comprising steps of: providing a driving node, which is formed on a line for connecting the transparent electrode patterns and a display driving circuit and a touch sensing unit for connecting the driving node and a touch sensing circuit; outputting an image by connecting the transparent electrode patterns and the image driving circuit in the display control period; sensing an illuminance by forming a predetermined voltage difference between at least one electrode patterns of the transparent electrode patterns and the lower electrode patterns in the illuminance sensing period; and sensing a touch by connecting the transparent electrode patterns and the touch sensing circuit through the touch sensing unit in the touch sensor control period, in which the display frame time is implemented in a combination of the display control period and the illuminance sensing period or a combination of the display control period and the touch sensor control period to be performed in a regular pattern, and a voltage supplied to the lower electrode pattern is relatively higher than that of the transparent electrode pattern in the illuminance sensing period, and the illuminance is measured by measuring the magnitude of a current formed by the transparent electrode pattern and the lower electrode pattern.

Herein, the case of being performed in the regular pattern may include various cases such as a case where the display frame time in which the illuminance sensing is implemented and the display frame time in which the touch sensing is implemented are alternately performed one to one and a case where the display frame time in which the illuminance sensing is implemented and the display frame time in which the touch sensing is implemented are performed at a ratio of 1:2, 1:3 or 1:10.

According to the method of sensing the illuminance of the PMOLED display of the present invention and the method of controlling the same, it is possible to implement an illuminance sensing serve as an in-cell type in the PMOLED and to implement illuminance sensing in a relatively most efficient manner by forming a predetermined voltage difference between a transparent electrode pattern and a lower electrode pattern.

According to the method of sensing the illuminance of the PMOLED display of the present invention and the method of controlling the same, it is possible to implement a touch serve as an in-cell type in the PMOLED and to efficiently eliminate the influence of the residual capacitance by implementing the touch function in the PMOLED.

Further, it was difficult to realize the touch function in the PMOLED, and it was not easy to implement the touch function in the execution condition for the image output of the PMOLED. However, in the method of sensing the illuminance of the PMOLED display of the present invention and the method of controlling the same, the condition for the image output of the PMOLED is satisfied and the conditions for the illuminance sensing and the touch sensing may be satisfied together.

DETAILED DESCRIPTION

Figure 1:
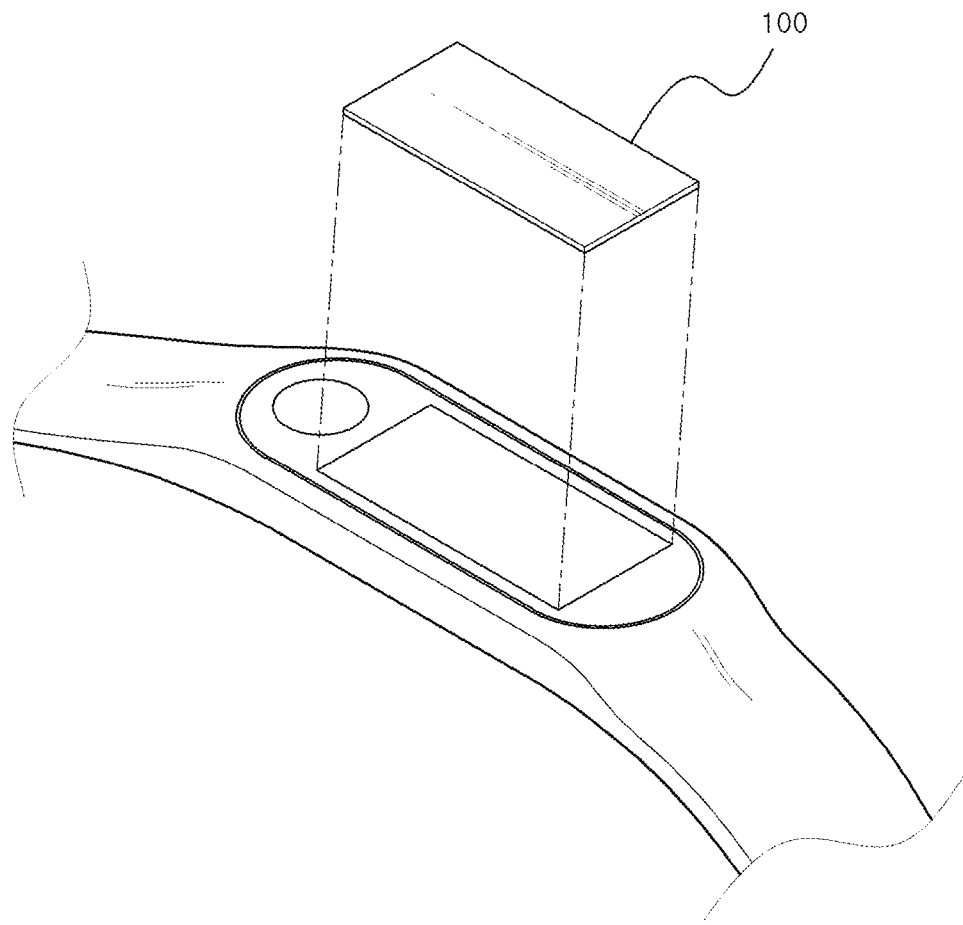
FIG. 1 is a perspective view for describing a use example of a passive matrix organic light emitting diode display according to an embodiment of the present invention.

Hereinafter, preferred embodiments of the present invention will be described in detail with reference to the annexed drawings, but should be not construed as limiting or restricting the present invention. For reference, in the present invention, like reference numerals designate substantially like constituent elements, the contents disclosed in different drawings under the rule can be cited and described, and the contents which are determined to be apparent to those skilled in the art or repeated can be omitted.

Figure 2:
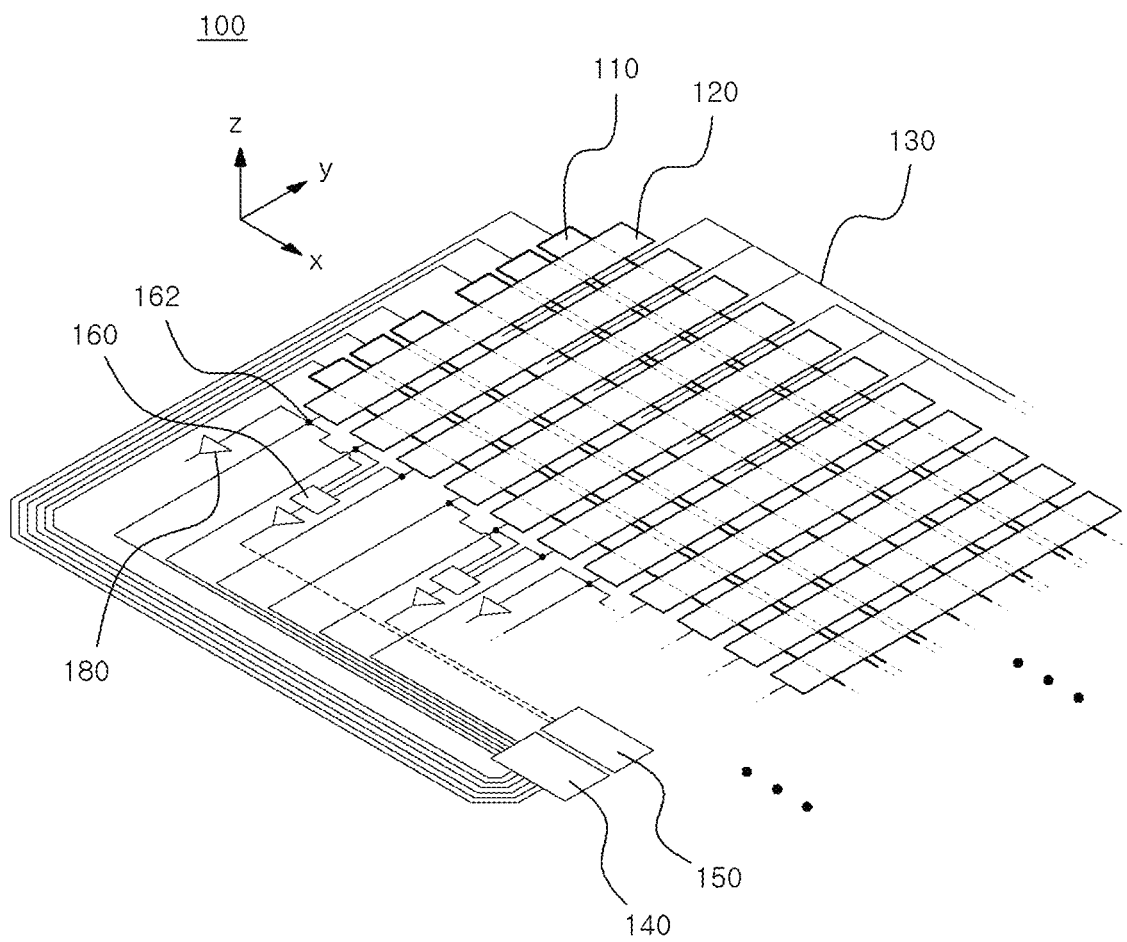
FIG. 2 is a perspective view for describing an electrode pattern structure of the passive matrix organic light emitting diode display according to the embodiment of the present invention.
Figure 3:
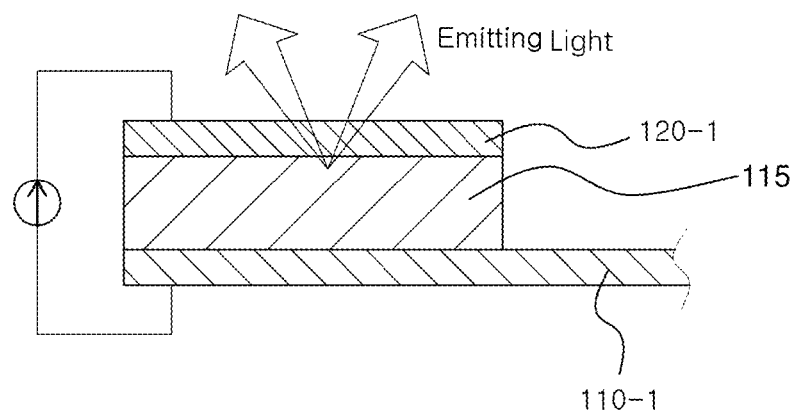
FIG. 3(a) is a diagram for describing a light emitting process using the organic compound layer of FIG. 2
FIG. 3(b) is a diagram for describing illuminance sensing process using the organic compound layer of FIG. 2.
Figure 3:
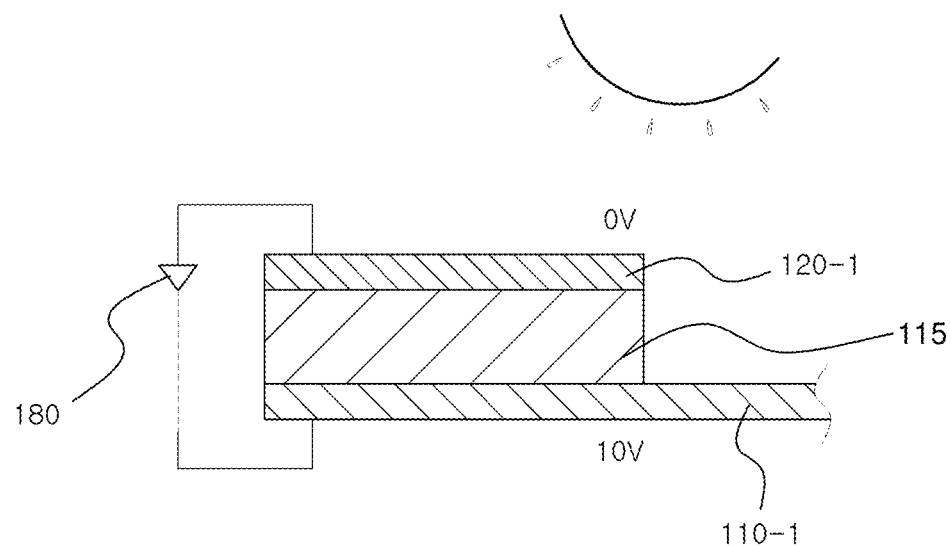
Figure 4:
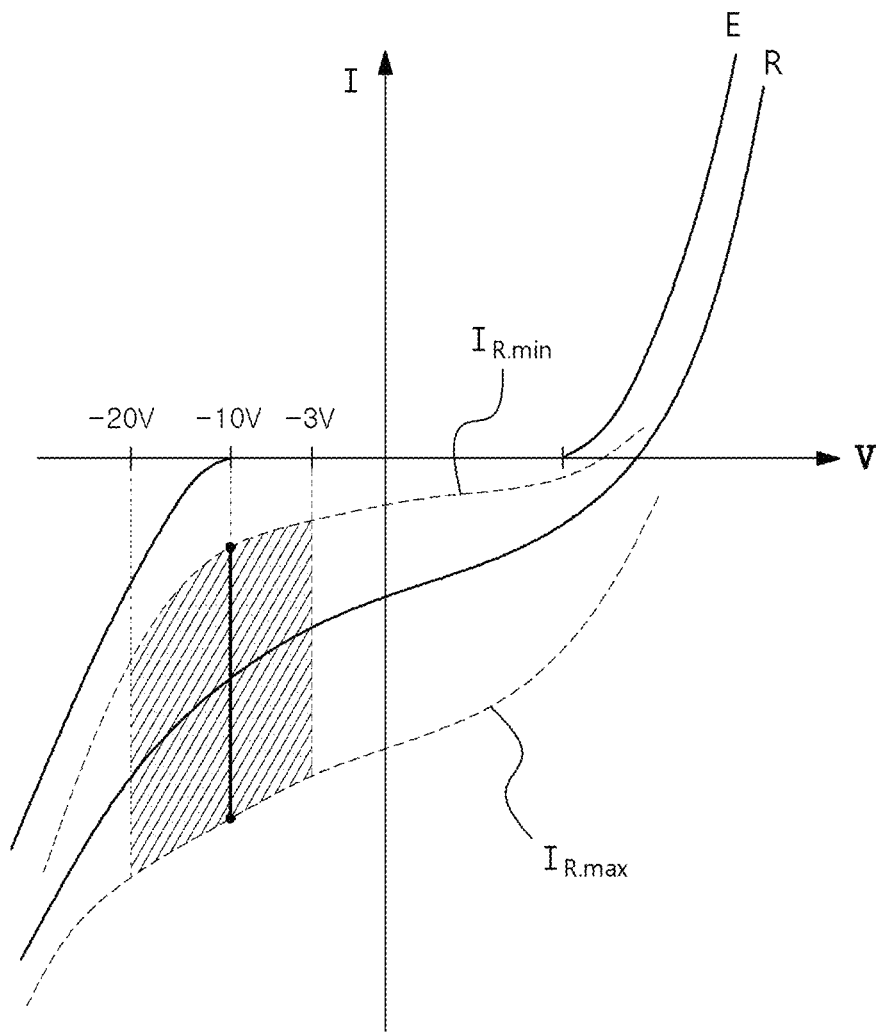
FIG. 4 is a diagram for describing a technical concept of the light emitting process and the illuminance sensing process using the organic compound layer of FIG. 2.
Figure 5:
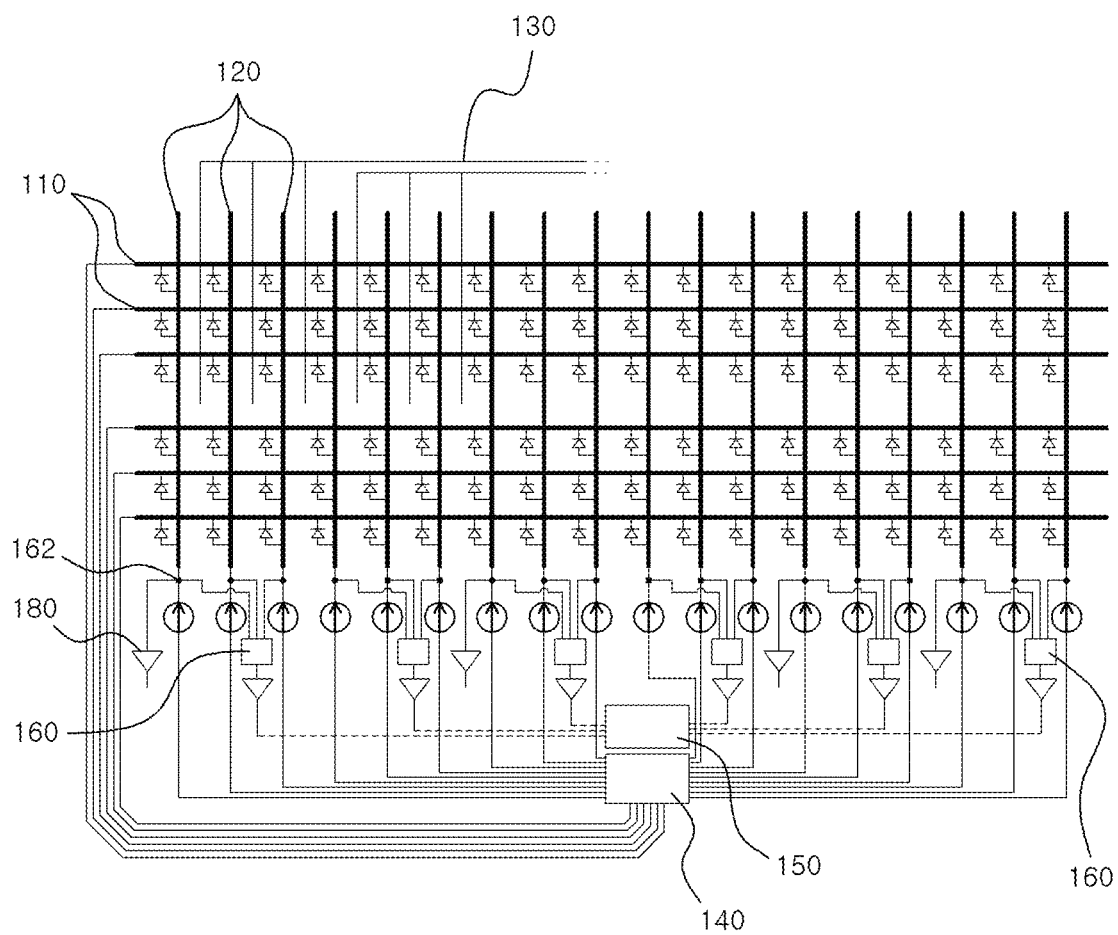
FIG. 5 is a structural diagram for describing a circuit structure of the PMOLED display of FIG. 2.

FIG. 1 is a perspective view for describing a use example of a passive matrix organic light emitting diode display according to an embodiment of the present invention, FIG. 2 is a perspective view for describing an electrode pattern structure of the passive matrix organic light emitting diode display according to the embodiment of the present invention, FIGS. 3(a) and (b) are diagrams for describing a light emitting process and an illuminance sensing process using the organic compound layer of FIG. 2 respectively, FIG. 4 is a diagram for describing a technical concept of the light emitting process and the illuminance sensing process using the organic compound layer of FIG. 2, and FIG. 5 is a structural diagram for describing a circuit structure of the PMOLED display of FIG. 2.

Referring to FIGS. 1 to 5, a PMOLED display 100 according to an embodiment of the present invention includes a plurality of lower electrode patterns 110 arranged in parallel, a plurality of transparent electrode patterns 120 arranged in parallel and being perpendicular to the lower electrode patterns 110, and an organic compound layer 115 interposed between the lower electrode pattern 110 and the transparent electrode pattern 120. The transparent electrode pattern 120 and the lower electrode pattern 110 are connected with an image driving circuit 140, and the PMOLED display 100 may display desired images or texts, and the like through a control of the image driving circuit 140.

Like FIG. 7 or 8 to be described below, the PMOLED display 100 according to the embodiment may implement image output, illuminance sensing, and touch sensing at different time periods by time-sharing a display frame time into a display control period, an illuminance sensing period, and a touch sensor control period, and alternately perform combinations of the image output, the illuminance sensing, and the touch sensing.

According to the present embodiment, the PMOLED display 100 may further include a touch sensing circuit 150 and an illuminance sensing circuit (not shown) in addition to the image driving circuit 140. Although the image driving circuit 140, the illuminance sensing circuit and the touch sensing circuit 150 are functionally separated from each other, the image driving circuit 140, the illuminance sensing circuit and the touch sensing circuit 150 may be formed in one integrated circuit (IC) or may be functionally separated from each other like the present embodiment.

However, instead of using a separate touch sensor for the touch sensing, the PMOLED display 100 according to the present embodiment may use the transparent electrode pattern 120 relatively located at the upper portion as a touch sensor. To this end, a driving node 162 is formed on a line connecting the transparent electrode pattern 120 and the image driving circuit 140, the touch sensing circuit 150 and the transparent electrode pattern 120 may be connected to each other through the driving node 162, and an illuminance sensing circuit and the transparent electrode pattern 120 may be electrically connected to each other through an illuminance sensing unit 180.

A touch sensing unit 160 may be provided between the driving node 162 and the touch sensing circuit 150. The touch sensing unit 160 may serve as a kind of switch which may selectively connect the transparent electrode pattern 120 and the touch sensing circuit 150, and implement the touch sensing by electrically connecting the transparent electrode pattern 120 and the touch sensing circuit 150 only in the touch sensor control period described above. The touch sensing unit 160 may also be provided as a separate component, but may also be included in an integrated circuit in which the touch sensing circuit 150 is formed.

The metal electrode pattern 130 is formed to have a length of about ½ of the length of the transparent electrode pattern 120 and the metal electrode pattern 130 may be divided into a region corresponding to the upper portion in a y-axis direction. Therefore, the position in an x-axis direction is measured by the transparent electrode pattern 120, the region sensed by the metal electrode pattern 130 is positioned at the upper portion in the y-axis direction, and the region which is not sensed by the metal electrode pattern 130 may be regarded as being located at the lower portion in the y-axis direction.

Functionally, the image driving circuit 140 controls the transparent electrode pattern 120 and the lower electrode pattern 110 for the image output in the display control period, and in the touch sensor control period, the touch sensing circuit 150 may control the transparent electrode pattern 120 and the lower electrode pattern 110 for the touch sensing. Of course, in the illuminance sensing period, the illuminance sensing circuit may control the transparent electrode pattern 120 and the lower electrode pattern 110 for the illuminance sensing.

Referring to FIG. 3(a), a positive voltage is supplied to a transparent electrode pattern 120-1 corresponding to a target pixel for the image output, and 0 V or a low voltage may be supplied to a lower electrode pattern 110-1. Since the voltage of the transparent electrode pattern 120-1 is relatively high, the current may flow from the transparent electrode pattern 120-1 to the lower electrode pattern 110-1, and the light may be emitted in the organic compound layer 115.

Referring to FIG. 3(*b*), a voltage of about 0 V may be supplied to the transparent electrode pattern 120-1 and a voltage of about 10 V may be supplied to the lower electrode pattern 110-1. This may form a tendency to be opposite to the image output, and light is not generated in the organic compound layer 115. However, when external light exists and is absorbed into the organic compound layer 115, a current having a different intensity may be generated depending on the intensity of external light.

Referring to FIG. 4, it can be seen that a change of the current at Curve E according to the voltage at the time of emitting light and a change of the current at Curve R according to the voltage at the time of absorbing the light are different from each other. In particular, it is confirmed that a change width (=IR.min−IR.max) of the current is different according to a voltage difference (=Vtransparent−Vlower) of the transparent electrode pattern 120-1 with respect to the lower electrode pattern 110-1.

In general, it can be seen that the change width (=IR.min−IR.max) of the current is wide in the range of the voltage difference of −20 V or more and −3 V or less, preferably −10 V. Therefore, in the present embodiment, a voltage of about 0 V is supplied to the transparent electrode pattern 120-1, and a voltage of about 10 V is supplied to the lower electrode pattern 110-1 to set a predetermined voltage difference to −10 V and measure the illuminance by using the current change depending on the light absorption.

According to the present embodiment, since the transparent electrode pattern 120 and the lower electrode pattern 110 are formed over a relatively large area in the PMOLED display 100, the transparent electrode pattern 120 and the lower electrode pattern 110 may be much affected by the residual capacitance therebetween. Such residual capacitance may adversely affect a Signal-to-Noise Ratio (SNR) in touch sensing, thereby making it impossible to detect a constant voltage change or a change in capacitance due to finger contact.

Figure 6:
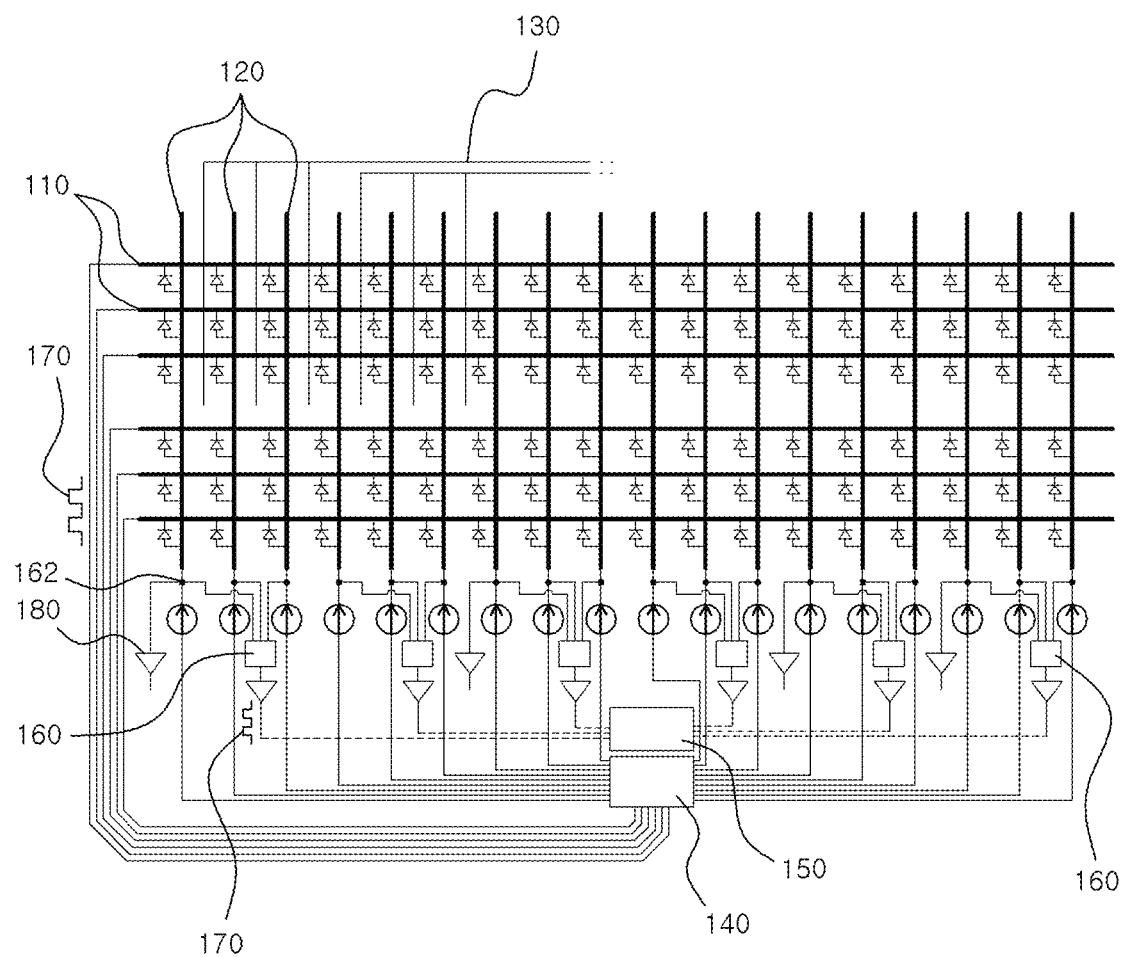
FIG. 6 is a diagram for describing a process of supplying a driving voltage for touch sensing in the PMOLED display according to the embodiment of the present invention.
Figure 7:
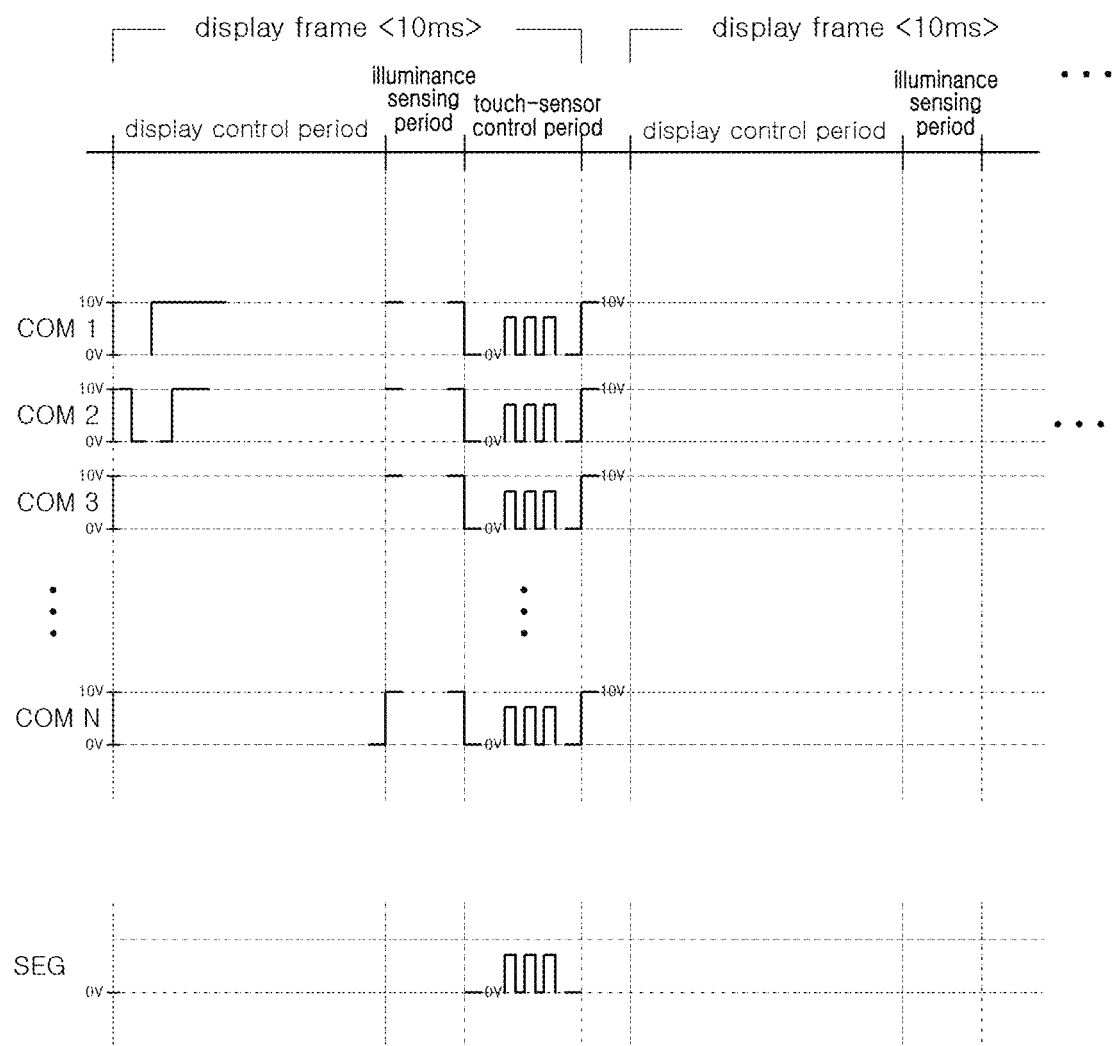
FIGS. 7 and 8 are diagrams for describing a process of controlling a lower electrode pattern in a time sharing state for each display frame in the PMOLED display according to the embodiment of the present invention.
Figure 8:
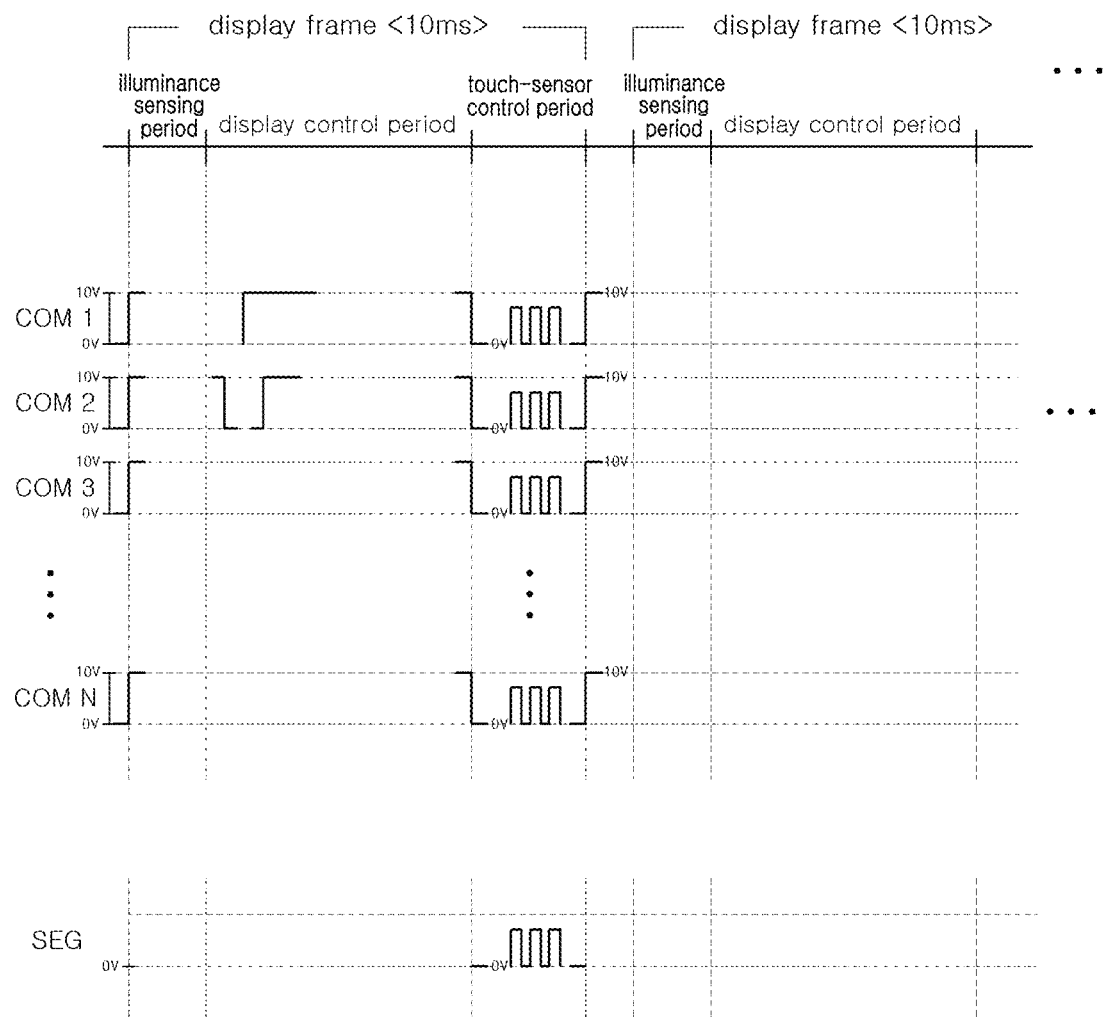

FIG. 6 is a diagram for describing a process of supplying a driving voltage for touch sensing in the PMOLED display according to the embodiment of the present invention, and FIGS. 7 and 8 are diagrams for describing a process of controlling a lower electrode pattern in a time sharing state for each display frame in the PMOLED display according to the embodiment of the present invention.

Referring to FIG. 6, a pulse-type driving voltage 170 may be provided to the transparent electrode pattern 120 and the lower electrode pattern 110 in the touch sensing step. The voltage is synchronized in the transparent electrode pattern 120 and the lower electrode pattern 110 by the driving voltage 170 to be changed, and the change in constant voltage or capacitance by external touch may be easily detected between the transparent electrode pattern 120 and the lower electrode pattern 110 regardless of the presence or absence of the residual capacitance.

Referring to FIG. 7, a maximum voltage of about 10 V may be formed at the lower electrode pattern 110 in the display control period. In this case, even though the pulse-type driving voltage is applied to the transparent electrode pattern 120 and the lower electrode pattern 110, the touch sensing may be smoothly performed.

In order to solve this problem, in the present embodiment, a touch reference voltage of about −3 V to 3 V may be uniformly supplied to all the lower electrode patterns 110 while starting the touch sensor control period. By maintaining the lower electrode pattern 110 at a relatively low voltage, the touch sensing using the transparent electrode pattern 120 may be smoothly performed.

However, immediately when the touch sensor control period ends, a display reference voltage of about 5 V or more and 20 V or less may be uniformly supplied to all the lower electrode patterns 110. For example, by supplying the display reference voltage of about 10 V to all the lower electrode patterns 110, pixels for display may be reset to maintain an initial state in which the organic light emitting diodes are not emitted as a whole.

As described above, the display reference voltage is preferably set to be higher than the touch reference voltage. Specifically, the touch reference voltage may be set to have a specific value within a range of about −3 V to about 3 V, and the display reference voltage may be set to have a specific value within a range of about 5 V to about 20 V.

In FIG. 7, a display frame is time-shared in the order of a display control period, an illuminance sensing period, and a touch sensor control period. In the illuminance sensing period, a voltage difference between the lower electrode pattern 110 and the transparent electrode pattern 120 used for the illuminance sensing is uniformly applied to about −10 V. The voltage of about 0 V is collectively provided to all the lower electrode patterns 110 while switching to the touch sensor control period, and the voltage of about 10 V is collectively provided to all the lower electrode patterns 110 when the touch sensor control period ends. Therefore, the display control period and the illuminance sensing period may be connected in harmony.

As shown in the drawing, in the touch sensor control period, the pulse-type driving voltage may be applied to the touch reference voltage and pulses having the same waveform may be supplied to the transparent electrode pattern (SEG) 120 and the lower electrode pattern (COM) 110.

In FIG. 8, the display frame is time-shared in the order of the illuminance sensing period, the display control period, and the touch sensor control period. In the illuminance sensing period, a voltage difference between the lower electrode pattern 110 and the transparent electrode pattern 120 used for the illuminance sensing is uniformly applied to about −10 V. In the display control period, while the transparent electrode patterns 120 are controlled in sequence for each lower electrode pattern 110, the image is output. The voltage of about 0 V is collectively provided to all the lower electrode patterns 110 while switching to the touch sensor control period, and the voltage of about 10 V may be collectively provided to all the lower electrode patterns 110 when the touch sensor control period ends.

Referring back to FIGS. 2 and 5, three transparent electrode patterns 120 may be grouped by one touch sensing unit 160. In the case of the image output, each transparent electrode pattern 120 may serve as an independent segment (SEG) electrode or an anode electrode. However, in the case of the touch sensing, the transparent electrode patterns 120 may be partially grouped without being used as an independent touch sensor to detect the body contact.

In general, the display using the PMOLED does not require a high resolution, and a screen is often constituted by a small screen. Therefore, the touch sensing may be required only when recognizing only a simple operation other than a high resolution. For example, it may be sufficient to detect only simple touching, division of right and left, or sweeping up or down movement.

For this purpose, in addition to three, two or more transparent electrode patterns 120 form a group, and in the touch sensor control period, the transparent electrode patterns 120 forming the group are connected to one by the touch sensing unit 160 to serve as one touch sensor.

For this purpose, one touch sensing unit 160 and a plurality of driving nodes 162 adjacent to each other may be connected to each other, and a plurality of transparent electrode patterns 120 may be grouped and connected to the touch sensing circuit by the touch sensing unit 160 using a switching circuit and the like. Therefore, it is possible to reduce the number of wires for touch sensing and facilitate circuit formation and the like.

Figure 9A:
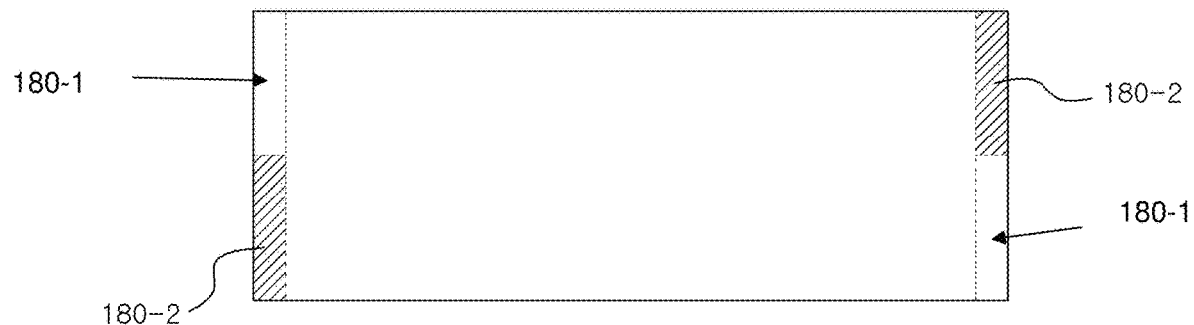
FIG. 9(a) is a diagram for describing a method of sensing an illuminance of a passive matrix organic light emitting diode display according to an embodiment of the present invention and FIG. 9(b) is diagram for describing the corresponding circuit structure.
Figure 9:
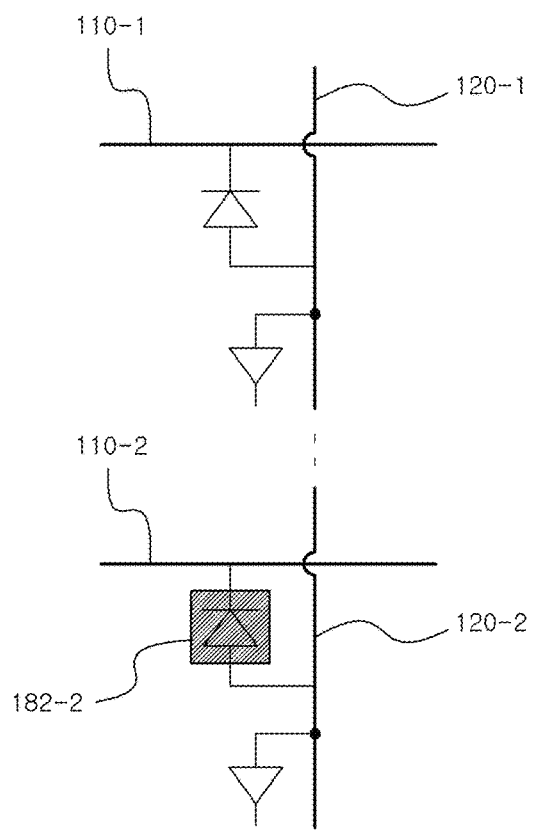

FIG. 9(a) is a diagram for describing a method of sensing an illuminance of a passive matrix organic light emitting diode display according to an embodiment of the present invention and FIG. 9(b) is a diagram for describing the corresponding circuit structure.

Referring to FIGS. 9(a) and (b), separate transparent electrode patterns and lower electrode patterns for illuminance sensing may be supplied to the left and right outer sides of the PMOLED display. Specifically, the PMOLED display includes a plurality of transparent electrode patterns and a plurality of lower electrode patterns, and a reference transparent electrode pattern 120-1 and a comparison transparent electrode pattern 120-2 are partially selected and defined from the plurality of transparent electrode patterns and a reference lower electrode pattern 110-1 and a comparison lower electrode pattern 110-2 are partially selected and defined from the plurality of lower electrode patterns. The reference transparent electrode pattern 120-1 and the reference lower electrode pattern 110-1 correspond to each other in the vertical direction and the comparison transparent electrode pattern 120-2 and the comparison lower electrode pattern 110-2 may be disposed to corresponding to each other in the vertical direction.

However, a blocking member 182-2 is covered on the comparison transparent electrode pattern 120-2 and the comparison lower electrode pattern 110-2 to prevent the light from flowing into the organic compound layer therebetween. Therefore, an electric feature formed by the reference transparent electrode pattern 120-1 and the reference lower electrode pattern 110-1 while keeping the remaining conditions the same except for a difference in which the light flows is compared with an electric feature formed by the comparison transparent electrode pattern 120-2 and the comparison lower electrode pattern 110-2 under the same conditions to measure an illuminance.

For illuminance sensing, the same electric feature as the current formed by the transparent electrode pattern and the lower electrode pattern is measured and intensities of the current or the like are compared to calculate the illuminance. The measured electric feature may not be just affected by the organic compound layer absorbing the light and may not exclude a possibility to be affected even by other factors. Therefore, in the present embodiment, the comparison transparent electrode pattern 120-2 and the comparison lower electrode pattern 110-2 are provided under the same remaining conditions except for a difference in which the light is absorbed in the organic compound layer to measure a comparison electric feature, and the comparison electric feature is compared with a normal electric feature to minimize a measurement error due to the noise other than the change in the illuminance.

For reference, a method of using a pair of comparison electrode patterns may form a combination with another method of sensing the illuminance described above. Specifically, the same predetermined voltage difference is formed between the reference transparent electrode pattern and the reference lower electrode pattern and between the comparison transparent electrode pattern and the comparison lower electrode pattern, a relatively high voltage is provided to the lower electrode pattern as compared with the transparent electrode pattern, and the illuminance may be measured by measuring a magnitude of the current formed by the transparent electrode pattern and the lower electrode pattern.

Further, a predetermined voltage difference at the transparent electrode pattern against the lower electrode pattern for the illuminance sensing may be selected in a range of −20 V to −3 V.

The electrode patterns used for illuminance sensing, for example, the reference transparent electrode pattern 120-1, the reference lower electrode pattern 110-1, the comparison transparent electrode pattern 120-2 and the comparison lower electrode pattern 110-2 may be used only for the illuminance sensing, and may be provided in the same or a different shape as or from other electrode patterns.

The reference transparent electrode pattern 120-1 and the reference lower electrode pattern 110-1 may be used for image output or touch sensing in addition to the illuminance sensing.

The illuminance sensing using the reference transparent electrode pattern 120-1, the reference lower electrode pattern 110-1, the comparison transparent electrode pattern 120-2 and the comparison lower electrode pattern 110-2 may be performed at the same time or a separated time as or from the image output for the PMOLED display.

In the present embodiment, a position 180-2 at which the comparison electrode pattern is disposed is positioned at left and right outer sides of the display and the positions thereof may be alternately disposed up and down. However, it is also possible that the positions thereof are disposed at the upper and lower outer sides of the display, or at the same position vertically or horizontally.

Figure 10:
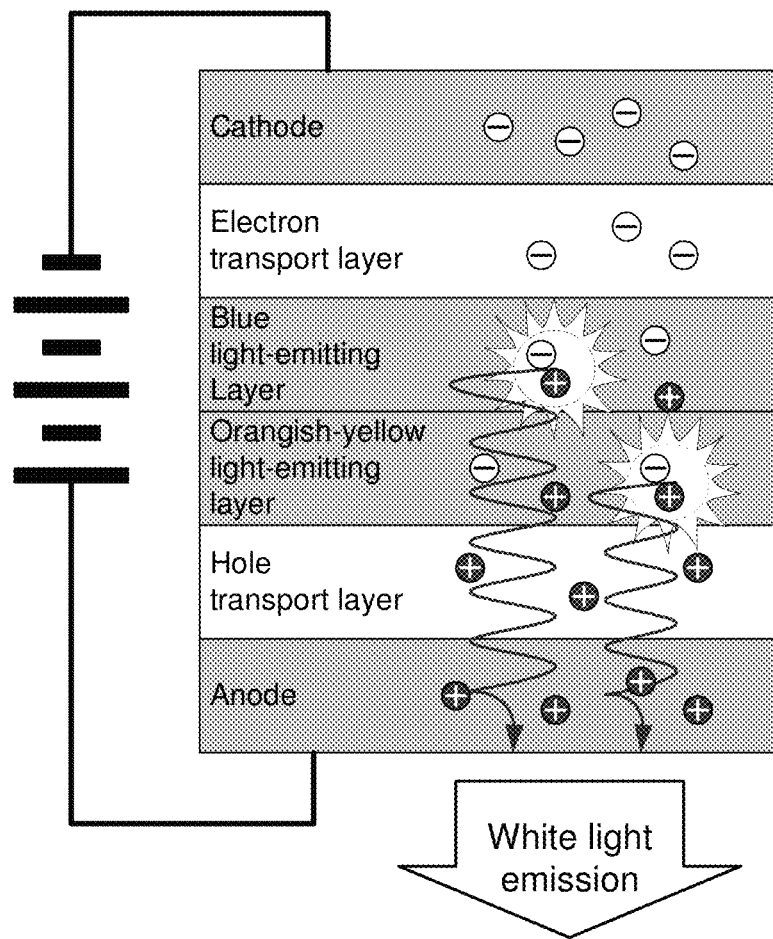
FIG. 10 is a diagram for showing a structure and emission principle of a white light-emitting PMOLED according to another embodiment of the present invention.

FIG. 10 shows a structure and emission principle of a white light-emitting PMOLED according to another embodiment. White light-emitting PMOLED is a popular choice for small size PMOLED panels ranging from 1" to 3".

The emission of white light from a PMOLED display is by the combination of blue light emission and orangish-yellow light emission. Although a true white light should consist of a full spectrum of visible lights (namely: red, orange, yellow, green, blue, indigo, and violet), blue plus yellow/orange is good enough for human perspective.

The white light-emitting PMOLED stack is composed of multiple thin film layers. These layers include an anode layer which is made from transparent ITO, a hole transport layer (HTL) which bridges the holes from anode to organic light-emitting material, an orangish-yellow light-emitting layer, a blue light-emitting layer, an electron transport layer (ETL) which bridges the electrons from cathode to organic light-emitting material and a cathode layer which is made usually from reflective aluminum.

The white light-emitting PMOLED illuminates when enough voltage (or energy) is applied across the anode and the cathode. This voltage (or energy) should be equal to or higher than the summation of potential barriers (or energy barriers) from the blue light-emitting layer and orangish-yellow light-emitting layer. As indicated in FIG. 10, the recombination of holes and electrons changes potential energy into light energy.

The reverse is true when the white light-emitting PMOLED is implemented with an illuminance sensor function. The luminous flux (i.e. light) incident on the surface should have enough energy to generate electron and hole pairs. Hence, a white light-emitting PMOLED cannot sense red, orange, yellow and green lights since they do not have enough energy. On the other hand, white light-emitting PMOLED is very sensitive to violet light and fairly sensitive to blue light.

Since human eyes are not sensitive to violet light, an illuminance sensing device that is very sensitive to violet is not useful. Hence, the illuminance sensor function of the white light-emitting PMOLED display may be implemented by covering the reference electrodes with a 'violet-and-above' light filter. This light filter should also be able to block ultra-violet (UV) light since around 10% of the total light output from the Sun is UV light. Referring back to FIGS. 9(a) and (b), the 'violet-and-above' light filter may be disposed at the dotted line rectangle region 180-1.

In another embodiment, the light-emitting PMOLED may be a color PMOLED display comprising one or more types light-emitting organic materials, such as red, green and blue light-emitting organic materials. Each color pixel in the color PMOLED display consists of a red sub-pixel, a green sub-pixel and a blue sub-pixel.

The color PMOLED display may further comprise one or more light filters to implement a multi-color illuminance sensor function. The one or more light filters may include a 'green-and-above' light filter configured to cover the red light-emitting organic material for sensing red light; a 'blue-and-above' light filter configured to cover the green light-emitting organic material for sensing green light; and a 'violet-and-above' light filter configured to cover the blue light-emitting organic material for sensing blue light.

Preferably, the 'green-and-above' light filter can block any light with wavelength shorter than or equal to 570 nm; the 'blue-and-above' light filter can block any light with wavelength shorter than or equal to 450 nm; and the 'violet-and-above' light filter can block any light with wavelength shorter than or equal to 380 nm.

Referring back to FIGS. 9(a) and (b), the one or more color light filters may be disposed at the dotted line rectangular region 180-1. The region 180-1 may be divided into a plurality of sub-regions in which each sub-region is for a particular color light sensing. In this particular embodiment, the region 180-1 may be divided into three sub-regions at which the 'green-and-above' light filter, the 'blue-and-above' light filter and 'violet-and-above' light filter are disposed respectively.

Although the present invention has been disclosed with reference to the preferred embodiments, those skilled in the art will appreciate that various modifications, additions and substitutions are possible, without departing from the scope and spirit of the invention as disclosed in the accompanying claims.

The invention claimed is:

1. A method of sensing an illuminance in a passive matrix organic light emitting diode display, the display including a plurality of lower electrode patterns arranged in parallel, a plurality of transparent electrode patterns arranged in parallel and being perpendicular to the lower electrode patterns, and an organic compound layer interposed between the lower electrode pattern and the transparent electrode pattern, the method comprising steps of:
   providing a reference transparent electrode pattern and a comparison transparent electrode pattern selected from the transparent electrode patterns;
   providing a reference lower electrode pattern and a comparison lower electrode pattern selected from the lower electrode patterns, corresponding to the reference transparent electrode pattern and the comparison transparent electrode pattern;
   blocking light flowing into the organic compound layer between the comparison transparent electrode pattern and the comparison lower electrode pattern; and
   measuring an illuminance by comparing an electric feature formed by the reference transparent electrode pattern and the reference lower electrode pattern with an electric feature formed by the comparison transparent electrode pattern and the comparison lower electrode pattern under the same conditions except for that light flowing into the organic compound layer between the comparison transparent electrode pattern and the comparison lower electrode pattern is blocked;
   wherein a same predetermined voltage difference is formed between the reference transparent electrode pattern and the reference lower electrode pattern and between the comparison transparent electrode pattern and the comparison lower electrode pattern for the illuminance sensing, and
   a voltage supplied to the lower electrode patterns is relatively higher than those of the transparent electrode patterns, and an illuminance is measured by measuring a magnitude of a current formed by the transparent electrode patterns and the lower electrode patterns.

2. The method of claim 1, wherein the predetermined voltage differences formed between the reference transparent electrode pattern and the reference lower electrode pattern and between the comparison transparent electrode pattern and the comparison lower electrode pattern for the illuminance sensing is selected in a range of −20 V to −3 V.

3. The method of claim 1, wherein the reference transparent electrode pattern, the reference lower electrode pattern, the comparison transparent electrode pattern and the comparison lower electrode pattern are used only for the illuminance sensing.

4. The method of claim 1, wherein the illuminance sensing using the reference transparent electrode pattern, the reference lower electrode pattern, the comparison transparent electrode pattern and the comparison lower electrode pattern is performed at a time period which is overlapped with a display control period for image output by the passive matrix organic light emitting diode display.

5. The method of claim 1, wherein
   the organic compound layer comprises a blue light-emitting layer and an orangish-yellow light-emitting layer;
   the organic compound layer between the comparison transparent electrode pattern and the comparison lower electrode pattern is covered with a 'violet-and-above' light filter, and
   the illuminance measuring is performed by comparing the electric feature formed by the reference transparent electrode pattern and the reference lower electrode pattern with the electric feature formed by the comparison transparent electrode pattern and the comparison lower electrode pattern under the same conditions except for that any light of wavelength shorter than wavelength of violet light flowing into the organic compound layer between the comparison transparent electrode pattern and the comparison lower electrode pattern is blocked.

6. The method of claim 1, wherein the organic compound layer comprises red, green and blue light-emitting organic materials;
   the organic compound layer between the comparison transparent electrode pattern and the comparison lower electrode pattern is divided into three sub-regions which are covered with a 'green-and-above' light filter, a 'blue-and-above' light filter and a 'violet-and-above' light filter respectively, and the illuminance measuring is performed by comparing the electric feature formed by the reference transparent electrode pattern and the reference lower electrode pattern with the electric feature formed by the comparison transparent electrode pattern and the comparison lower electrode pattern under the same conditions except for that any light of wavelength shorter than violet light flowing into the sub-region covered with a 'violet-and-above' light filter, any light of wavelength shorter than blue light flowing into the sub-region covered with a 'blue-and-above' light filter, and any light of wavelength shorter than green light flowing into the sun-region covered with a 'green-and-above' light filter are blocked.

7. The method of claim 1, wherein the illuminance sensing using the reference transparent electrode pattern, the reference lower electrode pattern, the comparison transparent electrode pattern and the comparison lower electrode pattern is performed at a time period which is separated from a display control period for image output by the passive matrix organic light emitting diode display.

8. A method of controlling a passive matrix organic light emitting diode display, the display including a plurality of lower electrode patterns arranged in parallel, a plurality of transparent electrode patterns arranged in parallel and being perpendicular to the lower electrode patterns, and an organic compound layer interposed between the lower electrode patterns and the transparent electrode patterns, to perform display output, illuminance sensing and touch sensing by time-sharing a display frame time into a display control period, an illuminance sensing period and a touch sensor control period, the method comprising steps of:

providing a driving node, which is formed on a line for connecting the transparent electrode patterns and a display driving circuit and a touch sensing unit for connecting the driving node and a touch sensing circuit;

outputting an image by connecting the transparent electrode patterns and the display driving circuit in the display control period;

sensing an illuminance by forming a predetermined voltage difference between at least one of the transparent electrode patterns and at least one of the lower electrode patterns in the illuminance sensing period; and sensing a touch by connecting the transparent electrode patterns and the touch sensing circuit through the touch sensing unit in the touch sensor control period, wherein in the illuminance sensing step, a voltage supplied to the lower electrode pattern for forming the predetermined voltage difference is relatively higher than that of the transparent electrode pattern for forming the predetermined voltage difference, and the illuminance is measured by measuring the magnitude of a current formed by the transparent electrode pattern for forming a predetermined voltage difference and the lower electrode pattern for forming a predetermined voltage difference.

9. The method of claim 8, wherein the predetermined voltage difference at the transparent electrode pattern for forming the predetermined voltage difference against the lower electrode pattern for forming the predetermined voltage difference in the illuminance sensing period is selected in a range of −20 V to −3 V.

10. The method of claim 8, wherein the display frame time is repetitively time-shared into the display control period, the illuminance sensing period and the touch sensor control period in sequence, or repetitively time-shared into the illuminance sensing period, the display control period and the touch sensor control period in sequence.

11. The method of claim 10, further comprising steps of:
supplying a touch reference voltage to all the lower electrode patterns at the beginning of the touch sensor control period; and
supplying a display reference voltage to all the lower electrode patterns after the touch sensor control period, wherein the display reference voltage is set to be higher than the touch reference voltage.

12. The method of claim 11, wherein the display reference voltage and the predetermined voltage difference are set to have the same absolute value.

13. The method of claim 11, wherein the touch reference voltage is set in a range of −3V to 3V and the display reference voltage is set in a range of 5V to 20V.

14. The method of claim 8, wherein in the touch sensing step, a pulse-type driving voltage is supplied to the transparent electrode patterns and the lower electrode patterns or a pulse-type driving voltage is supplied to one of the transparent electrode patterns and the lower electrode patterns when the other is floated.

15. The method of claim 8, wherein the touch sensing unit is connected to a plurality of adjacent driving nodes, and wherein in the touch sensing step, the transparent electrode patterns connected to the touch sensing circuit are used as a touch sensor.

16. A method of controlling a passive matrix organic light emitting diode display, the display including a plurality of lower electrode patterns arranged in parallel, a plurality of transparent electrode patterns arranged in parallel and being perpendicular to the lower electrode patterns, and an organic compound layer interposed between the lower electrode pattern and the transparent electrode pattern, to implement display output, illuminance sensing and touch sensing by time-sharing a display frame time into at least one of a display control period, an illuminance sensing period and a touch sensor control period, the method comprising steps of:

providing a driving node, which is formed on a line for connecting the transparent electrode patterns and a display driving circuit and a touch sensing unit for connecting the driving node and a touch sensing circuit;

outputting an image by connecting the transparent electrode patterns and an image driving circuit in the display control period;

sensing an illuminance by forming a predetermined voltage difference between at least one of the transparent electrode patterns and at least one of the lower electrode patterns in the illuminance sensing period; and sensing a touch by connecting the transparent electrode patterns and the touch sensing circuit through the touch sensing unit in the touch sensor control period, wherein the display frame time is implemented in a combination of the display control period and the illuminance sensing period or a combination of the display control period and the touch sensor control period to be formed in a regular pattern, and wherein a voltage supplied to the lower electrode pattern for forming a predetermined voltage difference is relatively higher than that of the transparent electrode pattern for forming a predetermined voltage difference in the illuminance sensing period, and the illuminance is measured by measuring the magnitude of a current formed by the transparent electrode pattern for forming a predetermined voltage difference and the lower electrode pattern for forming a predetermined voltage difference.

* * * * *